US012674089B2

(12) United States Patent
Mei

(10) Patent No.: US 12,674,089 B2
(45) Date of Patent: Jul. 7, 2026

(54) QUANTUM DOT MATERIAL AND PREPARATION METHOD THEREOF, QUANTUM DOT DISPLAY DEVICE, AND DISPLAY APPARATUS

(71) Applicants: Beijing BOE Technology Development Co., Ltd., Beijing (CN); BOE Technology Group Co., Ltd., Beijing (CN)

(72) Inventor: Wenhai Mei, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 1107 days.

(21) Appl. No.: 17/771,500

(22) PCT Filed: May 31, 2021

(86) PCT No.: PCT/CN2021/097504
§ 371 (c)(1),
(2) Date: Dec. 8, 2022

(87) PCT Pub. No.: WO2022/252088
PCT Pub. Date: Dec. 8, 2022

(65) Prior Publication Data

US 2024/0172463 A1 May 23, 2024

(51) Int. Cl.
*H10K 50/00* (2023.01)
*C09K 11/02* (2006.01)
*H10K 50/115* (2023.01)

(52) U.S. Cl.
CPC ............ *C09K 11/02* (2013.01); *H10K 50/115* (2023.02)

(58) Field of Classification Search
CPC ....... C09K 11/02; C09K 11/025; C09K 11/06; C09K 11/70; C09K 11/883; H10K 50/115; B82Y 20/00; H05B 33/14
USPC ........................................................... 257/40
See application file for complete search history.

(56) References Cited

U.S. PATENT DOCUMENTS

2016/0362601 A1* 12/2016 Ackermann ........... C09K 11/54
2017/0233645 A1* 8/2017 Zhong .................... C09K 11/02 252/301.16
2017/0346024 A1* 11/2017 Lee ........................ H05B 33/14
2018/0148638 A1* 5/2018 Ahn ....................... C09K 11/025
2018/0215695 A1* 8/2018 Chen ..................... H10K 50/115
(Continued)

FOREIGN PATENT DOCUMENTS

CN 101422621 A 5/2009
CN 106367060 A 2/2017
(Continued)

OTHER PUBLICATIONS

Office Action dated Jul. 21, 2025 for CN202180001388.5 and English Translation.

*Primary Examiner* — Sheikh Maruf
(74) *Attorney, Agent, or Firm* — Ling Wu; Stephen Yang; Ling and Yang Intellectual Property

(57) ABSTRACT

Embodiments of the present disclosure provide a quantum dot material including a quantum dot body and a primary ligand A" and a secondary ligand B" coated on a surface of the quantum dot body, and a carbon chain length of the primary ligand A" is 1.3 to 4.5 times a carbon chain length of the secondary ligand B".

12 Claims, 4 Drawing Sheets

(56) References Cited

U.S. PATENT DOCUMENTS

| | | | | |
|---|---|---|---|---|
| 2018/0298154 | A1* | 10/2018 | Lundorf | C04B 35/48 |
| 2019/0259962 | A1* | 8/2019 | Lee | H10K 85/30 |
| 2019/0276733 | A1* | 9/2019 | Mei | B01J 19/0013 |
| 2019/0276734 | A1* | 9/2019 | Kim | H10K 50/15 |
| 2019/0326539 | A1* | 10/2019 | Chung | H10H 20/812 |
| 2019/0359780 | A1* | 11/2019 | Lundorf | C04B 35/565 |
| 2020/0216754 | A1* | 7/2020 | Zhong | B01J 13/08 |
| 2020/0266348 | A1* | 8/2020 | Kim | C09K 11/883 |
| 2021/0043863 | A1* | 2/2021 | Jung | H10K 50/115 |
| 2021/0115332 | A1* | 4/2021 | Kim | H10K 50/115 |
| 2021/0115333 | A1* | 4/2021 | Min | C01B 19/00 |
| 2021/0155849 | A1* | 5/2021 | Stubbs | H10K 50/852 |
| 2021/0348051 | A1* | 11/2021 | Zhang | C09K 11/59 |
| 2021/0359229 | A1* | 11/2021 | Jung | C07F 7/0834 |
| 2021/0371732 | A1* | 12/2021 | Lee | H10K 50/115 |
| 2022/0085301 | A1* | 3/2022 | Lee | C09K 11/664 |
| 2022/0356394 | A1* | 11/2022 | Zhang | H10K 85/615 |
| 2023/0340322 | A1* | 10/2023 | Kim | C07C 323/52 |
| 2024/0150645 | A1* | 5/2024 | Chang | C09K 11/883 |

FOREIGN PATENT DOCUMENTS

| | | | |
|---|---|---|---|
| CN | 107522723 | A | 12/2017 |
| CN | 108624320 | A | 10/2018 |
| CN | 109456766 | A | 3/2019 |
| CN | 110746973 | A | 2/2020 |
| CN | 111484849 | A | 8/2020 |
| CN | 112823433 | A | 5/2021 |
| JP | 2020161442 | A | 10/2020 |
| KR | 1020190106819 | A | 9/2019 |

* cited by examiner

A A' A"

B B' B"

A A' A''

B B' B''

A + A' → A''

B + B' → B''

QUANTUM DOT MATERIAL AND PREPARATION METHOD THEREOF, QUANTUM DOT DISPLAY DEVICE, AND DISPLAY APPARATUS

CROSS-REFERENCE TO RELATED APPLICATION

This application is a national stage application of PCT Application No. PCT/CN2021/097504, which is filed on May 31, 2021, and entitled "Quantum Dot Material and Preparation Method thereof, Quantum Dot Display Device, and Display Apparatus", the content of which should be regarded as being incorporated herein by reference.

TECHNICAL FIELD

Embodiments of the present disclosure relate, but are not limited, to the field of quantum dot device preparation, and in particular, to a quantum dot material and a preparation method thereof, a quantum dot display device containing the quantum dot material, and a display apparatus containing the quantum dot display device.

BACKGROUND

Quantum Dots Light Emitting Diode Display (QLED Display) is a new display technology developed based on an organic light emitting display. A light emitting layer in QLED is a quantum dot layer, and its principle is that electrons and holes are injected into the quantum dot layer and then light emits in the quantum dot layer. Compared with Organic Light Emitting Diode Display (OLED Display), QLED has the advantages of narrow peak, high color saturation and wide color gamut.

With the deepening development of quantum dot display technology, the quantum efficiency has been continuously improved, and it has basically reached the level of industrialization. It has become a future trend to further adopt new processes and technologies to realize industrialization of the quantum dot display technology. It has become an important issue to prepare high-resolution QLED, QD-LCD (Quantum Dots-Liquid Crystal Display) and QD-OLED (Quantum Dots-Organic Light Emitting Diode Display) by patterning using quantum dots. However, it is easy to form residues after developing in the current patterning process using the quantum dots, which easily leads to the problem of color mixing in the full-color quantum dot display.

SUMMARY

The following is a summary for subject matters described herein in detail. The summary is not intended to limit the scope of protection of claims.

Embodiments of the present disclosure provide a quantum dot material including:

a quantum dot body and a primary ligand A" and a secondary ligand B" coated on a surface of the quantum dot body, and a carbon chain length of the primary ligand A" being 1.3 to 4.5 times a carbon chain length of the secondary ligand B".

Embodiments of the present disclosure further provide a preparation method for the above quantum dot material, including:

S1: coating quantum dots using a short-chain ligand A and a short-chain ligand B both having the number of carbon atoms of 3 to 5;

S2: forming quantum dots surface-coated with the primary ligand A" and the secondary ligand B" by photografting of the short-chain ligand A and the short-chain ligand B coated on the surface of the quantum dots surface-coated with the short-chain ligand A and the short-chain ligand B obtained in S1 with the compound A' and the compound B', respectively, so as to make a carbon chain length of the primary ligand A" be 1.3 to 4.5 times as long as that of the secondary ligand B"; optionally, at least one of the compound A" and the compound B" contains a polar group.

Embodiments of the present disclosure provide a quantum dot material including:

a quantum dot body and a primary ligand A" and a secondary ligand B" coated on a surface of the quantum dot body, at least one of the primary ligand A" and the secondary ligand B" containing a polar group.

Embodiments of the present disclosure further provide a preparation method for the above quantum dot material including:

S1: coating quantum dots using a short-chain ligand A and a short-chain ligand B both having the number of carbon atoms of 3 to 5;

S2: Forming quantum dots surface-coated with the primary ligand A" and the secondary ligand B" by photografting of the short-chain ligand A and the short-chain ligand B coated on the surface of the quantum dots surface-coated with the short-chain ligand A and the short-chain ligand B obtained in S1 with the compound A' and the compound B', respectively; at least one of the compound A' and the compound B' containing a polar group.

Embodiments of the present disclosure further provide a quantum dot display device including the above quantum dot material.

Embodiments of the present disclosure further provide a display apparatus including a plurality of the above quantum dot display devices.

After the accompanying drawings and detailed descriptions are read and understood, other aspects may be understood.

BRIEF DESCRIPTION OF DRAWINGS

Accompanying drawings are used to provide further understanding of technical solutions of the present disclosure, constitute a part of the specification, and are used to explain the technical solutions of the present disclosure together with embodiments of the present disclosure, thus do not constitute a limitation on the technical solutions of the present disclosure. The shape and size of the components in the accompanying drawings do not reflect true scale and are only intended to illustrate the contents of the disclosure.

Figure 1:
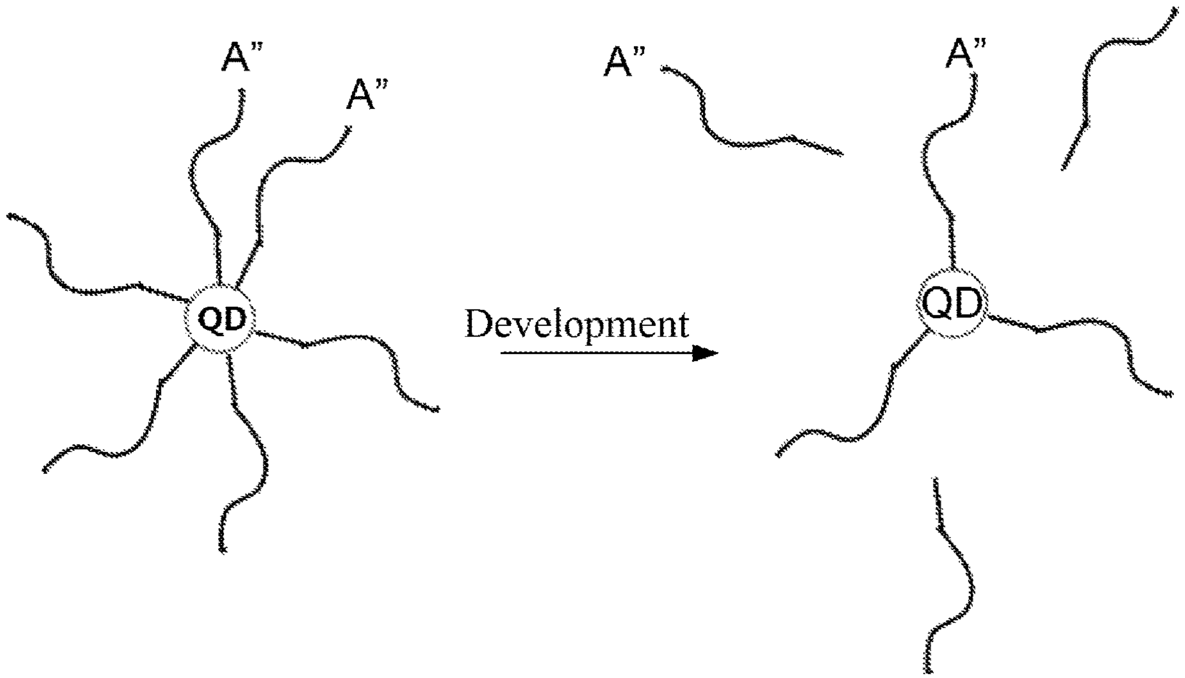
FIG. 1 is a schematic diagram of a change in ligand coverage rate of quantum dots containing only a primary ligand A" before and after development.

The meanings of the reference numbers in the drawings are:

10—substrate; 20—electron transport layer; 30—red light quantum dots film layer; 30'—red light quantum dots film layer to be removed; 40—green light quantum dots film layer; 40'—green light quantum dots film layer to be removed; 50—blue light quantum dots film layer; 50'—blue light quantum dots film layer to be removed; 60—hole transport layer; 70—hole injection layer; and 80—metal electrode.

DETAILED DESCRIPTION

A person skilled in the art should understand that modification or equivalent replacement may be made to the technical solutions of embodiments of the present disclosure without departing from the spirit and scope of the technical solutions of embodiments of the present disclosure, and should fall within the scope of the claims of the present disclosure.

In the accompanying drawings, the size of a constituent element, and the thickness of a layer or an area are sometimes exaggerated for clarity. Therefore, implementation manners of the disclosure are not necessarily limited to the sizes, and the shapes and sizes of each part in the accompanying drawings do not reflect the true scale. In addition, the accompanying drawings schematically show some examples, and the implementation manners of the disclosure are not limited to the shapes or numerical values shown in the accompanying drawings.

At present, most of the ligands used on surfaces of quantum dots are long-chain ligands with at least 8 or more carbon atoms. The long chain ligands are beneficial to increase the dispersion of the quantum dots in solutions and serve to stabilize quantum dot particles. However, the long-chain ligands are mostly aliphatic chains, which are prone to entanglement and bending in regions far away from the coordination site, resulting in steric hindrance at the periphery of the quantum dots, and preventing other long-chain ligands from further moving to the surface of quantum dots for coordination. In this case, although there are the long chain ligands on the surface of quantum dots for coordination, a coverage rate of surface ligands is low due to the steric hindrance. If some ligands fall off in a development process (as shown in FIG. 1), the coverage rate of the ligands will be lower, which will lead to the decrease of solubility of the quantum dots, and is not beneficial to the removal of the quantum dots.

Embodiments of the present disclosure provide a quantum dot material including a quantum dot body and a primary ligand A" and a secondary ligand B" coated on a surface of the quantum dot body. A carbon chain length of the primary ligand A" is 1.3 to 4.5 times a carbon chain length of the secondary ligand B".

In the quantum dot material of the embodiment of the present disclosure, the surface of the quantum dot body is coated with the primary ligand A" and the secondary ligand B" having different lengths. A carbon chain of the primary ligand A" is longer and the carbon chain of the secondary ligand B" is shorter. Due to the coexistence of the primary ligand A" and secondary ligand B", the coverage rate of ligands on the surface of the quantum dots is high, and the solubility of the quantum dots in solvents is good. And moreover, even if some ligands fall off in the development process, the whole quantum dots can still maintain high ligand coverage rate, so that the quantum dots maintain good solubility and are easy to be thoroughly washed away in the development process.

FIG. 1 is a schematic diagram of a change in ligand coverage rate of quantum dots (QDs) containing only a primary ligand A" before and after development. The ligand's falling off leads to the decrease of the coverage rate of the ligands on the surface of the quantum dots, and in turn leads to the decrease of the solubility of the quantum dots.

Figure 2:
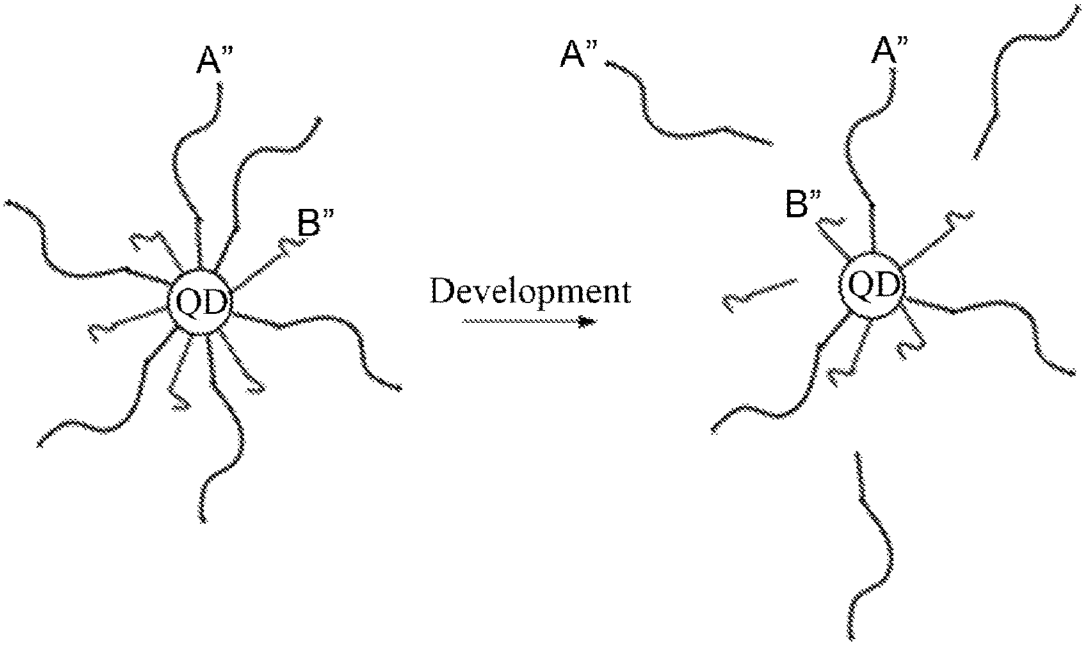
FIG. 2 is a schematic diagram of a change in ligand coverage rate of quantum dots containing both primary ligand A" and secondary ligand B" before and after development.

FIG. 2 is a schematic diagram of a change in ligand coverage rate of quantum dots containing both primary ligand A" and secondary ligand B" before and after development. After some ligands fall off, there is still a high ligand coverage rate on the surface of the quantum dots.

In some exemplary embodiments, the primary ligand A" may have a carbon chain length of 8 to 18 and the secondary ligand B" may have the carbon chain length of 4 to 6.

In some exemplary embodiments, the number of carbon atoms (including carbon atoms on the main chain and the branched chain) of the secondary ligand B" does not exceed half of the number of carbon atoms (including carbon atoms on the main chain and the branched chain) of the primary ligand A". At this time, the surface of the quantum dots may have the high ligand coverage rate.

In some exemplary embodiments, the primary ligand A" may be an aromatic hydrocarbon ligand or an aliphatic hydrocarbon ligand, and the secondary ligand B" may be an aliphatic hydrocarbon ligand to avoid the formation of large steric hindrance.

In some exemplary embodiments, the primary ligand A" may be a linear aliphatic hydrocarbon ligand having the number of carbon atoms in the range from 8 to 18. Alternatively, the primary ligand A" is an aliphatic hydrocarbon ligand containing a branched chain, and the number of carbon atoms of the branched chain is in the range from 1 to 6 or from 8 to 18. The secondary ligand B" may be a straight chain aliphatic hydrocarbon ligand with the number of carbon atoms in the range from 4 to 6. Alternatively, the secondary ligand B" may be an aliphatic hydrocarbon ligand containing a branched chain with the number of carbon atoms of the branched chain in the range from 1 to 2 or from 4 to 6 and the number of branched chains being 1. At this time, the solubility and carrier transport of the quantum dots are better.

In an embodiment of the present disclosure, neither the primary ligand A" nor the secondary ligand B" contains a large steric hindrance group, which includes a phenyl group, a triphenylamine group or a carbazole group.

In some exemplary embodiments, at least one of the primary ligand A" and the secondary ligand B" may contain a polar group.

The interaction between nonpolar aliphatic chains and nonpolar solvents is very weak, which is not conducive to the dispersion and dissolution of the quantum dots in the nonpolar solvents, so that the overall solubility of the quantum dots is low, resulting in the phenomenon that residues produced in the development of the quantum dots are generally unable to be completely cleaned during a direct lithography patterning process.

In the quantum dot material of the embodiment of the present disclosure, a polar group is introduced into a ligand chain, so that the solubility of the quantum material in the polar solvent is improved, which is beneficial to be completely removed during the development.

In some exemplary embodiments, the polar group may be selected from any one or more of an amide group, an ether group, a carbonyl group, and an ester group.

In an embodiment of the present disclosure, the primary ligand A" and the secondary ligand B" have similar polarity, so that the solubility of the quantum dots can be improved, avoiding the residues of the quantum dots after the development process and avoiding the color mixing problem in the full-color quantum dot display.

In some exemplary embodiments, the primary ligand A" and the secondary ligand B" may contain polar groups with the same polarity levels (the same strong polarity, moderate polarity, or weak polarity) and have approximately the same number of polar groups, so that the primary ligand A" and the secondary ligand B" may have similar polarity. For example, when the primary ligand A" contains hydrophilic groups such as amide group, ether group, carbonyl group and ester group, the secondary ligand B" also contains hydrophilic groups such as amide group, ether group, carbonyl group and ester group.

In some exemplary embodiments, the ligand may be a linear aliphatic hydrocarbon ligand having the following general formula:

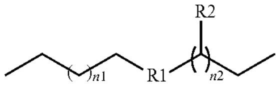

$n_1$=1 or 2, $n_2$=4 to 12 in the primary ligand A" and $n_2$=0 or 1 in the secondary ligand B".

Alternatively, the ligand may be an aliphatic hydrocarbon ligand containing a branched chain with the following general formula:

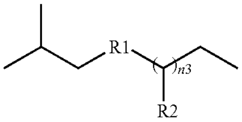

$n_3$=4 to 12 in the primary ligand A" and $n_3$=0 or 1 in the secondary ligand B";

$R_1$ may be a thioether group, an alcoholamine group, an ether group, an amide group or an epoxy group;

$R_2$ may be an amide group, an ether group, a carbonyl group or an ester group.

In some exemplary embodiments, the primary ligand A" may be

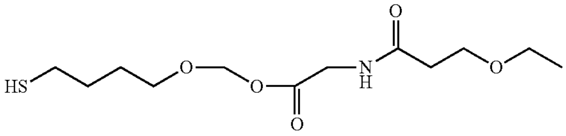

,

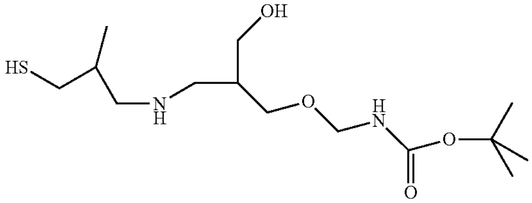

, or

-continued

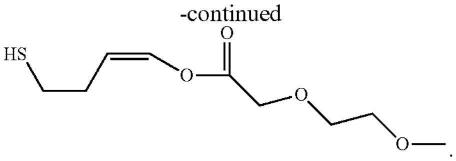

The secondary ligand B" may be

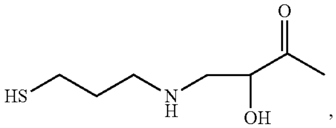

,

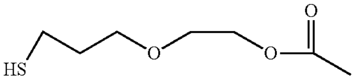

, or

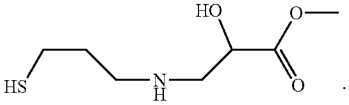

.

In some exemplary embodiments, the primary ligand A" may be

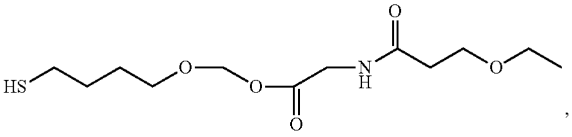 [SMILES: CCOCCC(=O)NCC(=O)OCOCCCCS]

, and the secondary ligand B" may be

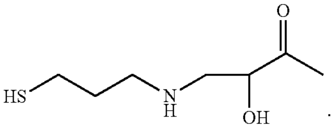

.

In some exemplary embodiments, the primary ligand A" may be

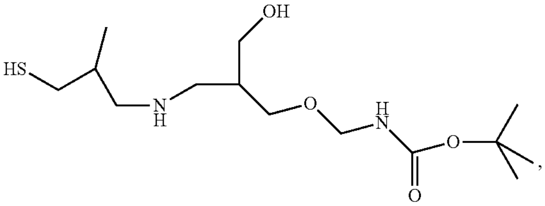 [SMILES: CC(CS)CNCC(CO)COCNC(=O)OC(C)(C)C]

, and the secondary ligand B" may be

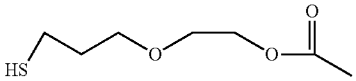

.

In some exemplary embodiments, the primary ligand A" may be

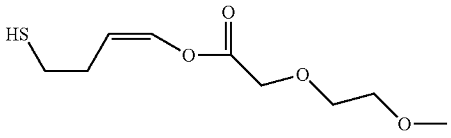

and the secondary ligand B" may be

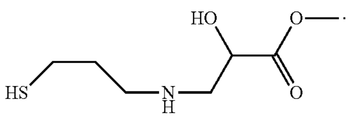

In some exemplary embodiments, a molar ratio of the primary ligand A" to the secondary ligand B" may range from 1:10 to 10:1, for example, 10:1, 9:1, 8:1, 7:1, 6:1, 5:1, 4:1, 3:1, 2:1, 1:1, 1:2, 1:3, 1:4, 1:5, 1:6, 1:7, 1:8, 1:9, and 1:10, which, at this time, better reduces the steric hindrance and improve the ligand coverage rate on the surface of the quantum dots.

Figure 3:
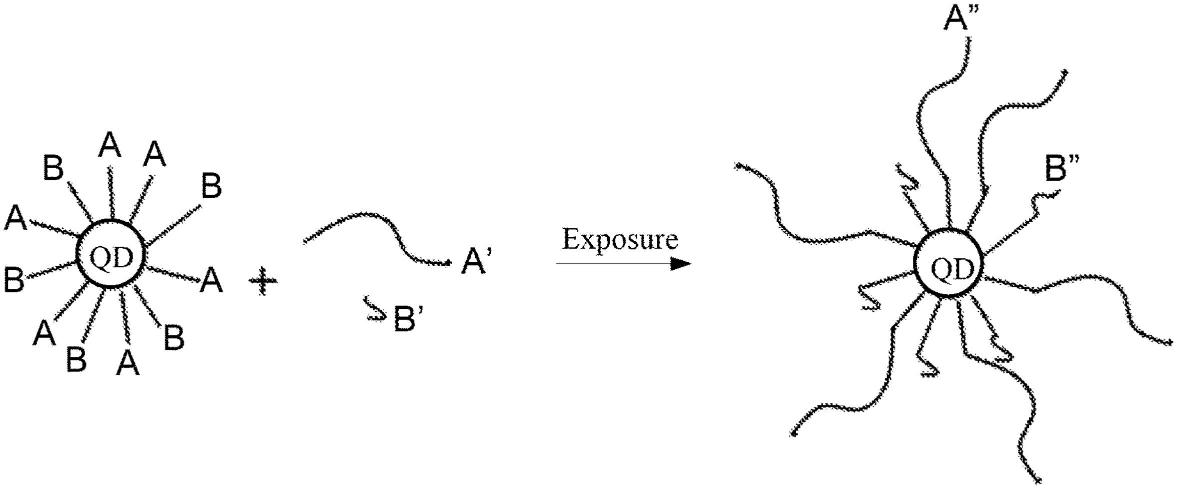
FIG. 3 is a process flow diagram of act S2 of a preparation method for quantum dots of an embodiment of the present disclosure.

Embodiments of the present disclosure further provide a preparation method for the above quantum dot material, including:

S1: coating quantum dots using a short-chain ligand A and a short-chain ligand B both having the number of carbon atoms of 3 to 5;

S2: as shown in FIG. 3, forming quantum dots surface-coated with the primary ligand A" and the secondary ligand B" by photo-grafting of the short-chain ligand A and the short-chain ligand B coated on the surface of the quantum dots surface-coated with the short-chain ligand A and the short-chain ligand B obtained in S1 with the compound A' and the compound B', respectively, so as to make a carbon chain length of the primary ligand A" be 1.3 to 4.5 times as long as that of the secondary ligand B". Optionally, at least one of the compound A" and the compound B" contains a polar group.

In some exemplary embodiments, the molar ratio of the short-chain ligand A to the short-chain ligand B may range from 10:1 to 1:10, for example, 10:1, 9:1, 8:1, 7:1, 6:1, 5:1, 4:1, 3:1, 2:1, 1:1, 1:2, 1:3, 1:4, 1:5, 1:6, 1:7, 1:8, 1:9, and 1:10.

In some exemplary embodiments, the carbon chain length of the compound A' may range from 2 to 16, and the carbon chain length of the compound B' may range from 2 to 4.

In some exemplary embodiments, a molar ratio of the compound A' to the short-chain ligand A may be 1.2:1 and the molar ratio of the compound B' to the short-chain ligand B may be 1.2:1, so that the short-chain ligand A and the short-chain ligand B coated on the surface of the quantum dots obtained in S1, whose surfaces are coated with the short-chain ligand A and the short-chain ligand B, can be completely reacted off.

In an embodiment of the present disclosure, groups contained in the compound A' that may be photo-grafted with the short-chain ligand A are different from groups contained in the compound B' that may be photo-grafted with the short-chain ligand B. It may be ensured that in the photo-grafting reaction, the compound A' only reacts with the short-chain ligand A but not with the short-chain ligand B, while the compound B' only reacts with the short-chain ligand B but not with the short-chain ligand A.

In some exemplary embodiments, terminals of the short-chain ligand A and the short-chain ligand B may contain hydrophilic groups so that the primary ligand A" and the secondary ligand B" have hydrophilic groups. The polarity of the hydrophilic groups is generally larger, so that solubility and stability of the quantum dots in a hydrophilic solvent are better. The hydrophilic group may be a carboxyl group, an amino group, a hydroxyl group, an aldehyde group or a carbonyl group.

In some exemplary embodiments, the short-chain ligand A may be:

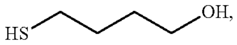
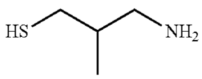
or
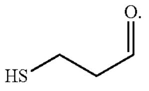

The short-chain ligand B may be:

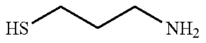
or
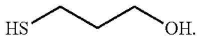

In some exemplary embodiments, the short-chain ligand A may be

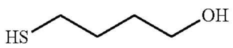

and the short-chain ligand B may be

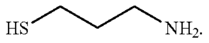

In some exemplary embodiments, the short-chain ligand A may be

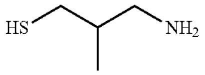

and the short-chain ligand B may be

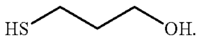

In some exemplary embodiments, the short-chain ligand A may be

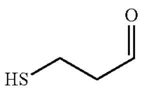

and the short-chain ligand B may be

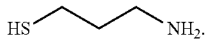

In some exemplary embodiments, the group contained in the compound A' that may be photo-grafted with the short-chain ligand A is a carbonyl group, an ether group or an amide group, and the group contained in the compound B' that may be photo-grafted with the short-chain ligand B is a carbonyl group, an ether group or an amide group.

In some exemplary embodiments, the compound A' may be:

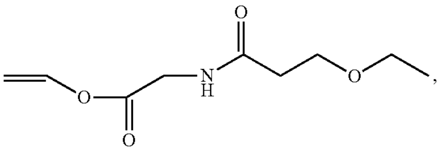
,

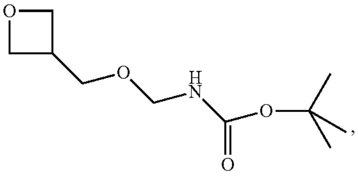
, or

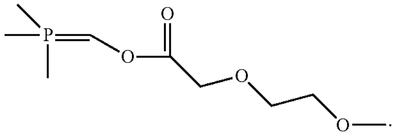

The compound B' may be

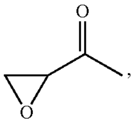
, 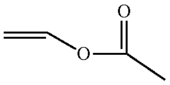 or 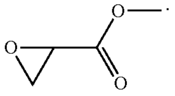

In some exemplary embodiments, the compound A' may be

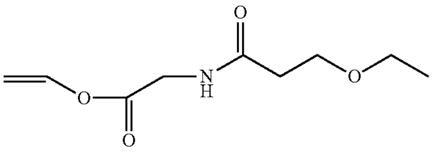

and the compound B' may be

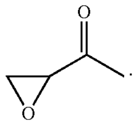

In some exemplary embodiments, the compound A' may be

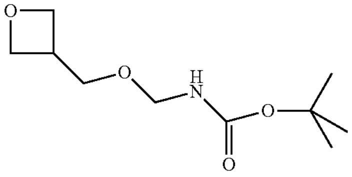

and the compound B'' may be

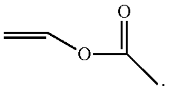

In some exemplary embodiments, the compound A' may be

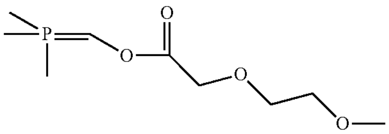

and the compound B' may be

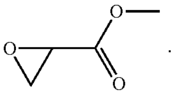

Embodiments of the present disclosure further provide a quantum dot material. The quantum dot material includes:

a quantum dot body and a primary ligand A'' and a secondary ligand B'' coated on a surface of the quantum dot body, and at least one of the primary ligand A'' and the secondary ligand B'' containing a polar group.

In an embodiment of the present disclosure, the primary ligand A'' and the secondary ligand B'' have similar polarity.

In some exemplary embodiments, the polar group may be selected from any one or more of an amide group, an ether group, a carbonyl group, and an ester group.

Embodiments of the present disclosure further provide a preparation method for the above quantum dot material, including:

S1: Coating quantum dots using a short-chain ligand A and a short-chain ligand B both having the number of carbon atoms of 3 to 5;

S2: Forming quantum dots surface-coated with the primary ligand A'' and the secondary ligand B'' by photo-grafting of the short-chain ligand A and the short-chain ligand B coated on the surface of the quantum dots surface-coated with the short-chain ligand A and the short-chain ligand B obtained in S1 with the compound A' and the compound B', respectively; at least one of the compound A' and the compound B' containing a polar group.

In some exemplary embodiments, the act S1 may include exchanging an original ligand on the surface of the quantum dots containing the original ligand using the short-chain ligand A and the short-chain ligand B both having the number of carbon atoms of 3 to 5, so as to make the short-chain ligand A and the short-chain ligand B be coated on the surface of the quantum dots.

Embodiments of the present disclosure further provide a quantum dot display device including the above quantum dot material.

In some exemplary embodiments, the quantum dot display device may include an anode, a cathode, and a light emitting layer disposed between the anode and the cathode. A material for the light emitting layer may be the quantum dot material.

In some exemplary embodiments, the quantum dot display device may be a QLED device, a QD-OLED device, or a QD-LCD device.

In some exemplary embodiments, the quantum dot display device is a quantum dot light emitting device (QLED) including an anode, a cathode, and a quantum dot light emitting layer disposed between the anode and the cathode, and the quantum dot light emitting layer including the above quantum dot material.

In some exemplary embodiments, the quantum dot display device is a QD-OLED device or a QD-LCD device, including a color conversion layer including the above quantum dot material.

Embodiments of the present disclosure further provide a display apparatus, including the above quantum dot display device.

The quantum dot material and the preparation method thereof and use in the patterned QLED device of the embodiments of the present disclosure are illustrated below.

Example 1

Preparation of Quantum Dots with High Ligand Coverage Rate:

Cadmium selenide/zinc sulfide quantum dots with pyridine as an original ligand were dissolved in a toluene solution to form a 20 mg/ml quantum dot solution; 1 ml of the quantum dot solution was taken and 0.5 ml of 4-mercapto-1-butanol (a short-chain ligand A) and 3-mercapto-1-propylamine (a short-chain ligand B) were added thereto, with a molar ratio of the short-chain ligand A to the short-chain ligand B $n_A$:$n_B$=2:1 (which may be in the range from 1:10 to 10:1 in other examples); the original pyridine ligand was replaced by the short-chain ligand A and the short-chain ligand B for ligand exchange after stirring at room temperature for 4 hours; then, the quantum dots surface-coated with the short-chain ligand A and the short-chain ligand B were precipitated with toluene; after removing the supernatant, 0.5 ml of ethanol was used to dissolve the quantum dots surface-coated with the short-chain ligand A and the short-chain ligand B; precipitation was made with 3 ml of toluene, the supernatant was discarded after centrifugation, and then was drained under vacuum at 80 degrees Celsius to obtain quantum dot powders surface-coated with the short-chain ligand A and the short-chain ligand B; the quantum dot powders surface-coated with the short-chain ligand A and the short-chain ligand B were then re-dissolved in ethanol to form a quantum dot solution surface-coated with the short-chain ligand A and the short-chain ligand B having a concentration of 20 mg/ml.

Figure 4:
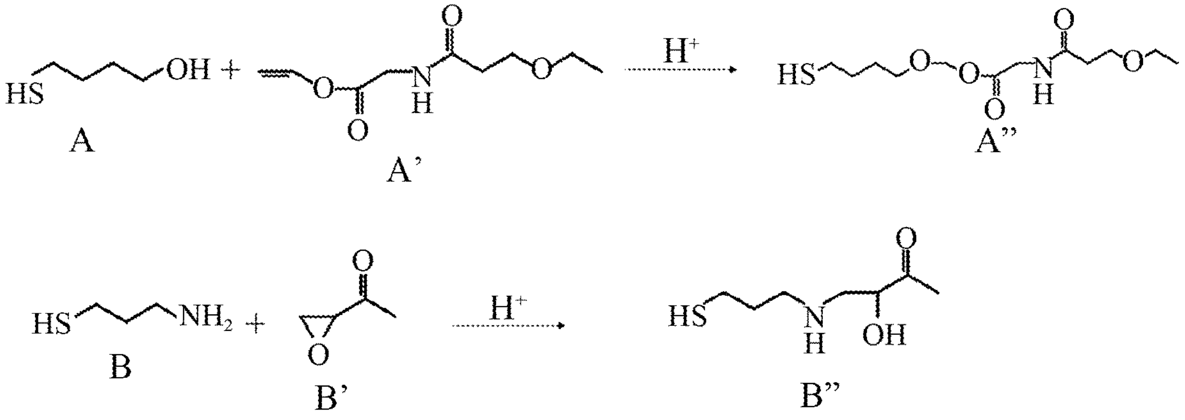
FIG. 4 is a flowchart of a chemical reaction of Example 1 of the present disclosure.
Figure 5:
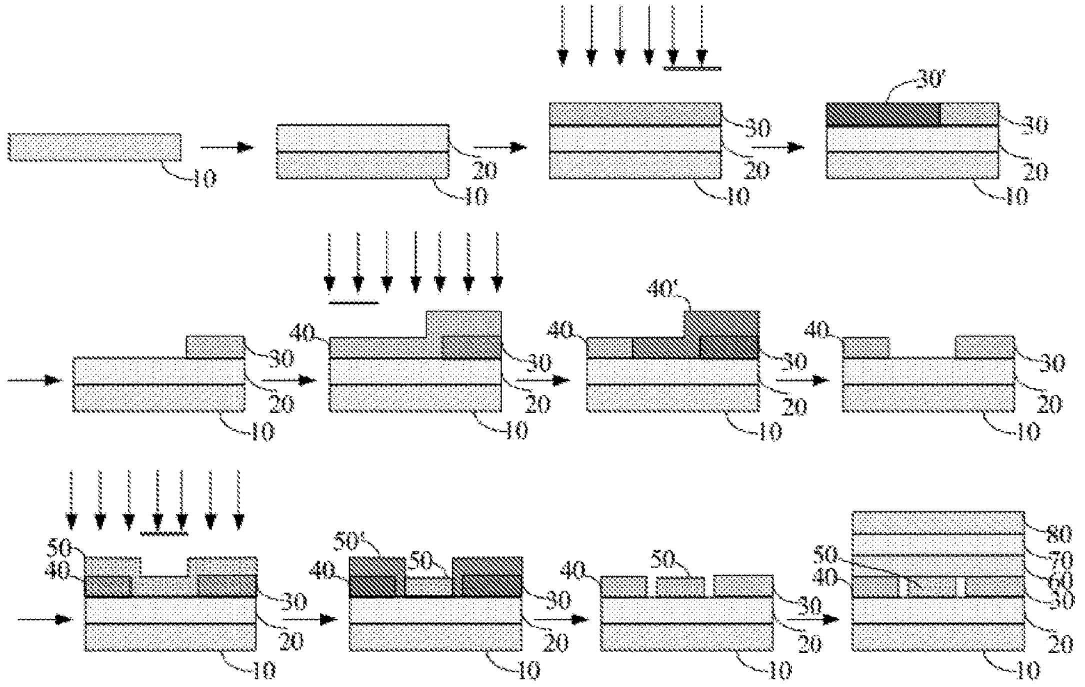
FIG. 5 is a flowchart of the preparation of a full-color QLED.

Fabrication of QLED Device:

As shown in FIGS. 4 and 5, and FIG. 4 is a flowchart of a chemical reaction of the example; FIG. 5 is a flowchart of preparation of full-color QLED. Zinc oxide nanoparticles were spin-coated on a substrate 10 deposited with indium tin oxide (ITO) at 2500 rpm to be used as an electron transport layer 20 and then annealed at 120 degrees Celsius for 5 minutes. A solution of red light quantum dots surface-coated with the short-chain ligand A and the short-chain ligand B prepared in the example is spin-coated at 3000 rpm to form a red light quantum dots (RQDs) film layer 30. A toluene solution containing PAG (2-(4-methoxystyrenyl)-4,6-bis (trichloromethyl)-1,3,5-triazine) of the compound A'

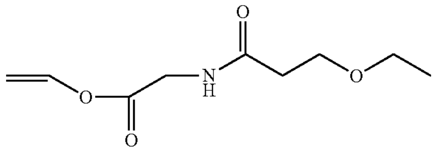

and compound B'

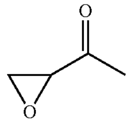

was dropwise added on the quantum dots film layer, exposed (energy 100 mj), developed with chloroform (120s), heated at 120 degrees Celsius for 10 minutes after the development was completed, and the red light quantum dots film layer to be removed 30' was removed to form a patterned red light quantum dots film layer 30. A patterned green light quantum dots (GQD) film layer 40 and a patterned blue light quantum dots (BQD) film layer 50 were prepared according to the same process. After completion, a hole transport layer 60, a hole injection layer 70 and a metal electrode 80 (e.g. a silver electrode) were prepared by evaporation to complete device preparation.

Example 2

Preparation of Quantum Dots with High Ligand Coverage Rate:

Cadmium selenide/zinc sulfide quantum dots with pyridine as an original ligand were dissolved in a toluene solution to form a 20 mg/ml quantum dot solution; 1 ml of quantum dot solution was taken and 0.5 ml of 3-mercapto-2-methyl-1-propylamine (a short-chain ligand A) and 3-mercapto-1-propanol (a short-chain ligand B) were added thereto, with a molar ratio of short-chain ligand A to short-chain ligand B nA:nB=2:1 (which may be in the range from 10:1 to 1:10 in other examples); the original pyridine ligand was replaced by the short-chain ligand A and the short-chain ligand B for ligand exchange after stirring at room temperature for 4 hours; then, the quantum dots surface-coated with the short-chain ligand A and the short-chain ligand B were precipitated with toluene; after removing the supernatant, 0.5 ml of ethanol was used to dissolve the quantum dots surface-coated with the short-chain ligand A and the short-chain ligand B; precipitation was made with 3 ml of toluene, the supernatant was discarded after centrifugation, and then was drained under vacuum at 80 degrees Celsius to obtain quantum dot powders surface-coated with the short-chain ligand A and the short-chain ligand B; the quantum dot powders surface-coated with the short-chain ligand A and the short-chain ligand B were then re-dissolved in ethanol to form a quantum dot solution surface-coated with the short-chain ligand A and the short-chain ligand B having a concentration of 20 mg/ml.

Figure 6:
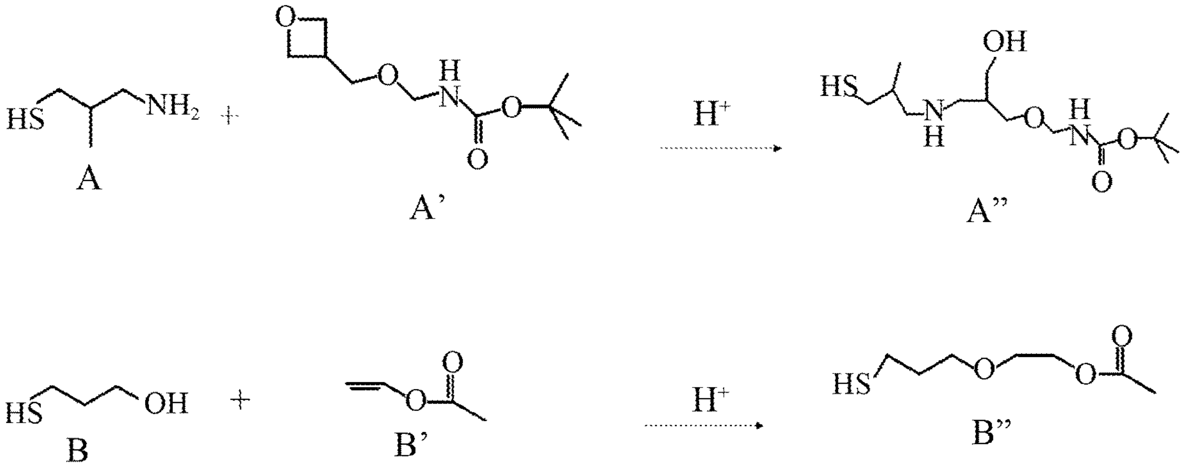
FIG. 6 is a flowchart of a chemical reaction of Example 2 of the present disclosure.

Fabrication of QLED Device:

As shown in FIG. 6, FIG. 6 is a flowchart of a chemical reaction of the example. Zinc oxide nanoparticles were spin-coated on a substrate 10 deposited with indium tin oxide (ITO) at 2500 rpm to be used as an electron transport layer 20 and then annealed at 120 degrees Celsius for 5 minutes. A solution of red light quantum dots surface-coated with the short-chain ligand A and the short-chain ligand B prepared in the example is spin-coated at 3000 rpm to form a red light quantum dots (RQDs) film layer 30. A toluene solution containing PAG (2-(4-methoxystyrenyl)-4,6-bis (trichloromethyl)-1,3,5-triazine) of the compound A'

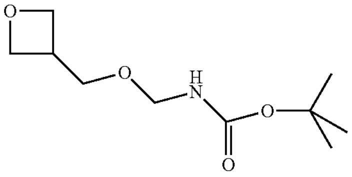

and compound B'

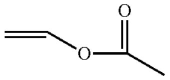

was dropwise added on the quantum dots film layer, exposed (energy 100 mj), developed with chloroform (120s), heated at 120 degrees Celsius for 10 minutes after the development was completed to form a patterned red light quantum dots film layer 30. A patterned green light quantum dots (GQD) film layer 40 and a patterned blue light quantum dots (BQD) film layer 50 were prepared according to the same process. After completion, a hole transport layer 60, a hole injection layer 70 and a metal electrode 80 (e.g. a silver electrode) were prepared by evaporation to complete device preparation.

Example 3

Preparation of Quantum Dots with High Ligand Coverage Rate:

Cadmium selenide/zinc sulfide quantum dots with pyridine as an original ligand were dissolved in a toluene solution to form a 20 mg/ml quantum dot solution; 1 ml of quantum dot solution was taken and 0.5 ml of 3-mercaptopropionaldehyde (a short-chain ligand A) and 3-mercapto-1-propylamine (a short-chain ligand B) were added thereto, with a molar ratio of short-chain ligand A to short-chain ligand B nA:nB=1:1 (which may be in the range from 10:1 to 1:10 in other examples); the original pyridine ligand was replaced by the short-chain ligand A and the short-chain ligand B for ligand exchange after stirring at room temperature for 4 hours; then, the quantum dots surface-coated with the short-chain ligand A and the short-chain ligand B were precipitated with toluene; after removing the supernatant, 0.5 ml of ethanol was used to dissolve the quantum dots surface-coated with the short-chain ligand A and the short-chain ligand B; precipitation was made with 3 ml of toluene, the supernatant was discarded after centrifugation, and then was drained under vacuum at 80 degrees Celsius to obtain quantum dot powders surface-coated with the short-chain ligand A and the short-chain ligand B; the quantum dot powders surface-coated with the short-chain ligand A and the short-chain ligand B were then re-dissolved in ethanol to form a quantum dot solution surface-coated with the short-chain ligand A and the short-chain ligand B having a concentration of 20 mg/ml.

Figure 7:
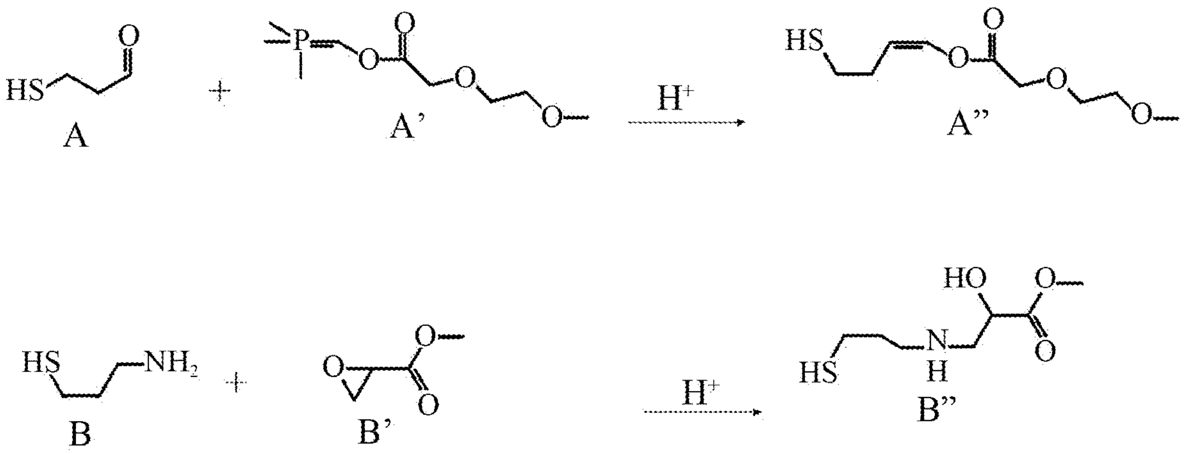
FIG. 7 is a flowchart of a chemical reaction of Example 3 of the present disclosure.

Fabrication of QLED Device:

As shown in FIG. 7, FIG. 7 is a flowchart of a chemical reaction of the example. Zinc oxide nanoparticles were spin-coated on a substrate 10 deposited with indium tin oxide (ITO) at 2500 rpm to be used as an electron transport layer 20 and then annealed at 120 degrees Celsius for 5 minutes. A solution of red light quantum dots surface-coated with the short-chain ligand A and the short-chain ligand B prepared in the example is spin-coated at 3000 rpm to form a red light quantum dots (RQDs) film layer 30. A toluene solution containing PAG (2-(4-methoxystyrenyl)-4,6-bis (trichloromethyl)-1,3,5-triazine) of the compound A'

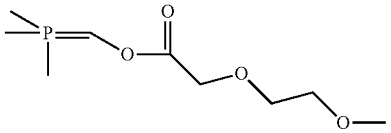

and compound B'

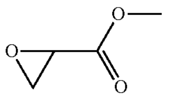

was dropwise added on the quantum dots film layer, exposed (energy 100 mj), developed with chloroform (120s), heated at 120 degrees Celsius for 10 minutes after the development was completed to form a patterned red light quantum dots film layer 30. A patterned green light quantum dots (GQD) film layer 40 and a patterned blue light quantum dots (BQD) film layer 50 were prepared according to the same process. After completion, a hole transport layer 60, a hole injection layer 70 and a metal electrode 80 (e.g. a silver electrode) were prepared by evaporation to complete device preparation.

Although the embodiments disclosed in the present disclosure are as above, the described contents are only embodiments adopted for convenience of understanding the present disclosure and are not intended to limit the present disclosure. Any person skilled in the art to which the present disclosure pertains may make any modification and change in forms and details of implementation without departing from the spirit and scope disclosed in the present disclosure. However, the scope of patent protection of the present disclosure is still subject to the scope defined in the appended claims.

The invention claimed is:

1. A quantum dot material comprising:

a quantum dot body and a primary ligand A" and a secondary ligand B" coated on a surface of the quantum dot body, and a carbon chain length of the primary ligand A" being 1.3 to 4.5 times a carbon chain length of the secondary ligand B"; wherein a molar ratio of the primary ligand A" to the secondary ligand B" ranges from 1:10 to 10:1 for reducing steric hindrance and improving ligand coverage rate on a surface of the quantum dot body;

the primary ligand A" and the secondary ligand B" have polar groups with a same polarity level and have a same number of the polar groups.

2. The quantum dot material according to claim 1, wherein the primary ligand A" has a carbon chain length of 8 to 18 and the secondary ligand B" has a carbon chain length of 4 to 6.

3. The quantum dot material according to claim 1, wherein the number of carbon atoms of the secondary ligand B" does not exceed half of the number of carbon atoms of the primary ligand A"; or the primary ligand A" is an aromatic hydrocarbon ligand or an aliphatic hydrocarbon ligand, and the secondary ligand B" is an aliphatic hydrocarbon ligand.

4. The quantum dot material according to claim 1, wherein the primary ligand A" is a linear aliphatic hydrocarbon ligand having the number of carbon atoms in the range from 8 to 18, or the primary ligand A" is an aliphatic hydrocarbon ligand containing a branched chain, with the number of carbon atoms of the branched chain being in the range from 1 to 6 or from 8 to 18, wherein the secondary ligand B" is a linear aliphatic hydrocarbon ligand having the number of carbon atoms in the range from 4 to 6, or the secondary ligand B" is an aliphatic hydrocarbon ligand containing a branched chain, with the number of carbon atoms of the branched chain being in the range from 1 to 2 or from 4 to 6 and the number of branched chains being 1; or neither the primary ligand A" nor the secondary ligand B" contains a large steric hindrance group, and the large steric hindrance group comprising a phenyl group, a triphenylamine group or a carbazole group.

5. The quantum dot material according to claim 1, wherein a polar group of the polar groups is selected from any one or more of an amide group, an ether group, a carbonyl group, and an ester group.

6. The quantum dot material according to claim 1, wherein the ligand is a linear aliphatic hydrocarbon ligand having the following general formula:

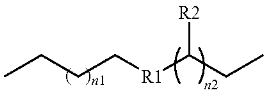

$n_1$=1 or 2, $n_2$=4 to 12 in the primary ligand A" and $n_2$=0 or 1 in the secondary ligand B"; or the ligand is an aliphatic hydrocarbon ligand containing a branched chain having the following general formula:

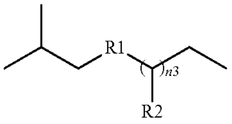

$n_3$=4 to 12 in the primary ligand A" and $n_3$=0 or 1 in the secondary ligand B";

$R_1$ is a thioether group, an alcoholamine group, an ether group, an amide group or an epoxy group;

$R_2$ is an amide group, an ether group, a carbonyl group or an ester group.

7. The quantum dot material according to claim 1, wherein the primary ligand A" is

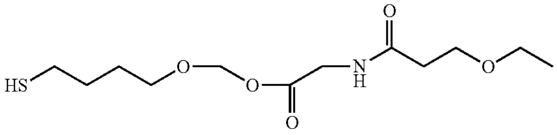

,

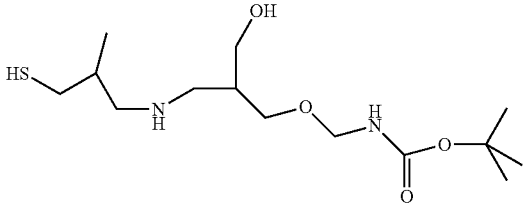

, or

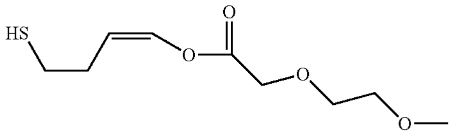

;

the secondary ligand B" is

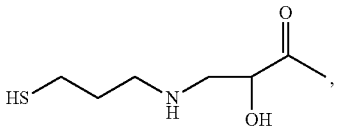

,

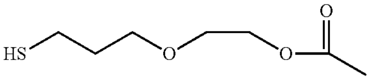

, or

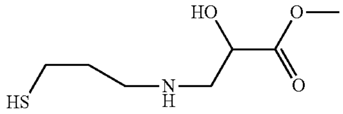

.

8. A quantum dot material, the quantum dot material comprising:

a quantum dot body and a primary ligand A" and a secondary ligand B" coated on a surface of the quantum dot body, wherein a molar ratio of the primary ligand A" to the secondary ligand B" ranges from 1:10 to 10:1 for reducing steric hindrance and improving ligand coverage rate on a surface of the quantum dot body;

the primary ligand A" and the secondary ligand B" have polar groups with a same polarity level and have a same number of the polar groups.

9. The quantum dot material according to claim 8, wherein the primary ligand A" and the secondary ligand B" have similar polarity; and/or the polar group is selected from any one or more of an amide group, an ether group, a carbonyl group, and an ester group.

10. A quantum dot display device comprising a quantum dot material according to claim 1.

11. The quantum dot display device according to claim 10, comprising: an anode, a cathode, and a light emitting layer disposed between the anode and the cathode, wherein the material of the light emitting layer is the quantum dot material.

12. A display apparatus comprising a plurality of quantum dot display devices according to claim 10.

* * * * *